United States Patent [19]

Hartman et al.

[11] 3,806,774

[45] Apr. 23, 1974

[54] BISTABLE LIGHT EMITTING DEVICES

[75] Inventors: Adrian Ralph Hartman, Westfield; Norman Edwin Schumaker, North Plainfield, both of N.J.

[73] Assignee: Bell Telephone Laboratories, Incorporated, Murray Hill, N.Y.

[22] Filed: July 10, 1972

[21] Appl. No.: 270,094

[52] U.S. Cl...... 317/235 R, 317/234 V, 317/235 K, 317/235 N, 317/235 AD, 317/235 AP

[51] Int. Cl. .............................................. H01l 9/00

[58] Field of Search............................ 317/234, 235

[56] References Cited

UNITED STATES PATENTS

| | | | |
|---|---|---|---|
| 3,479,517 | 11/1969 | Bray et al. | 250/213 |
| 3,502,518 | 3/1970 | Antell | 148/186 |
| 3,419,764 | 12/1968 | Kasugai et al. | 317/234 |
| 3,440,497 | 4/1969 | Keyes et al. | 317/234 |
| 3,725,821 | 4/1973 | Mitsui | 331/107 |
| 3,448,350 | 6/1969 | Yamashita et al. | 317/234 |
| 3,611,069 | 10/1971 | Galginaitis et al. | 317/234 |

*Primary Examiner*—Rudolph V. Rolinec
*Assistant Examiner*—E. Wojciechowicz
*Attorney, Agent, or Firm*—L. H. Birnbaum

[57] ABSTRACT

A light emitting device is described which has stable conducting and nonconducting states to provide internal memory for use primarily in matrix arrays. The device comprises a three layer structure of an n-type region of GaP or $Al_xGa_{1-x}P$, a semi-insulating region of GaP or $Al_xGa_{1-x}P$, and a region of p-type GaP. The semi-insulating region is doped with a deep level impurity compensated by a shallow level impurity, which impurities are chosen to provide good trapping centers for injected carriers but weak recombination centers. The P-type region is doped with impurities which will permit recombination therein for efficient luminescence in the conducting state.

12 Claims, 2 Drawing Figures

BISTABLE LIGHT EMITTING DEVICES

BACKGROUND OF THE INVENTION

This invention relates to semiconductor light emitting devices, and in particular devices which exhibit two stable states at room temperature.

Semiconductor light emitting devices are currently the subject of extensive research and development for use in a variety of visual display systems. GaP electroluminescent devices in particular have demonstrated feasibility, and advantages over filament bulbs due to their small size, economy and long lifetime.

In the generation of a suitable electroluminescent alphanumeric display, for example, the dot matrix format is frequently used. In such an arrangement each device is coupled at a crosspoint of a set of column and row conductors. An individual device is illuminated only when both the row and column conductors with which it is coupled are activated. This arrangement reduces the number of external connections to the array. However, in order to select the proper elements to form a desired character, the row and column conductors must be strobed continuously by means of an external memory. Otherwise, unwanted elements will be energized as the result of the conductor pattern.

It is therefore desirable to fabricate a GaP electroluminescent device which will exhibit bistable characteristics so that memory is incorporated in the device itself and the need for strobing an array of devices is eliminated. Such a display would not only be cheaper to fabricate, but would also permit addressing at currents well within the useful efficiency range of the devices.

GaAs light emitting devices which exhibit this bistable or negative resistance characteristic have been previously fabricated. (See, for example, U.S. Pat. No. 3,443,166.) Similarly, some attempts have also been made to produce a bistable GaP electroluminescent device. However, these devices have demonstrated negative resistance only at very low temperature. (See, for example, Epstein, "Properties of Green Electroluminescence and Double Injection in Epitaxial Gallium Phosphide at Liquid Nitrogen Temperature," Transactions of the Metallurgical Society of AIME, Vol. 239, page 370 (March 1967).

SUMMARY OF THE INVENTION

In accordance with the invention, a GaP electroluminescent device is described which has stable conducting and nonconducting states at room temperature. The device comprises three distinct regions of semiconductor material. The substrate is n-type GaP or $Al_xGa_{1-x}P$. Grown thereon, preferably by liquid phase epitaxy, is a region of semi-insulating GaP or $Al_xGa_{1-x}P$. This region contains a deep level impurity together with a shallow impurity, which deep impurity provides trapping sites for injected carriers but weak recombination sites. Overlying the semi-insulating region is a region of p-type GaP again preferably formed by liquid phase epitaxy. This region is doped with an impurity which allows recombination therein for photon emission.

BRIEF DESCRIPTION OF THE DRAWING

These and other features of the invention will be delineated in detail in the description to follow. In the drawing.

DETAILED DESCRIPTION OF THE INVENTION

Figure 1:
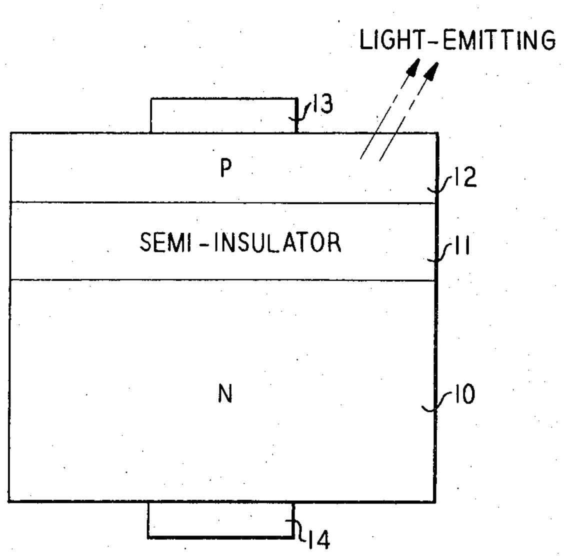
FIG. 1 is a frontal view of an electroluminescent device in accordance with one embodiment of the invention.

The basic device is shown in FIG. 1. Fabrication begins with a substrate of GaP, 10, which has been formed by a standard liquid encapsulated Czochralski process. The substrate is doped with suitable doner impurities to make it an n-type conductivity region. Typically, the dopant is Se at a concentration of about $3–7\times10^{17}$ $cm^{-3}$, although several other dopants known in the art may be utilized such as Te or S. In general, a doping concentration of $3\times10^{17}$ - $1\times10^{18}$ $cm^{-3}$ is desirable for maximum electron injection.

Next, a semi-insulating region of GaP, 11, is grown atop the substrate. The method employed is preferably liquid phase epitaxy since it has been found that this process generally results in devices with the longest lifetime. However, vapor phase epitaxy may also be employed.

In the liquid phase epitaxy process, the substrate is placed in a quartz growth apparatus with a gallium melt. In one particular process, 40 grams of gallium were used, although the amount of gallium can vary greatly. The melt is saturated with GaP and $Ga_2O_3$. The weight of these materials, of course, depends on their solubility in gallium and as such is a function of the temperature of the process. In the particular process described here, 3.5 mole percent GaP and 0.22 mole percent of $Ga_2O_3$ are needed to saturate the solution (2.10 g and 0.281 g respectively for a melt of 40 g of gallium). Carbon is also present in sufficient amount to saturate the melt (at least 1 mg for 40 g of Ga. The apparatus is heated to approximately 1,020 degrees C and the substrate is immersed in the melt. This initial temperature can be in the range 800 degrees to 1,100 degrees C. The apparatus is then cooled at a rate of 0.1 degree/min to 0.4 degree/min until the temperature reaches approximately 980 degrees C resulting in the epitaxial growth of layer 11 to a thickness of 30–40 $\mu$. This final temperature is determined by the thickness of the layer desired and the volume of the melt used. In this device, the layer thickness must be at least 10 $\mu$ and generally will not be more than approximately 100 $\mu$.

The semi-insulating region, 11, thus formed, contains the deep donor impurity oxygen with a concentration of $7\times10^{16}$ $cm^{-3}$ compensated by the shallow acceptor carbon with a concentration of $1\times10^{16}$ $cm^{-3}$. In general, the desired concentration of oxygen is $1\times10^{16}$ to $3\times10^{17}$, and the concentration of carbon should be in the range $5\times10^{15}$ to $3\times10^{17}$ $cm^{-3}$, with the requirement that in all cases the concentration of carbon is less than that of oxygen.

A layer of p-type GaP, 12, is then grown on the semi-insulating region. Again, this is preferably accomplished by a liquid phase epitaxy technique. The procedure is essentially the same as that required to produce the semi-insulating region, with the exception that in addition to $Ga_2O_3$ and GaP the melt includes the shallow acceptor Zn instead of carbon. In this melt, 3.5 mole percent GaP, 0.22 mole percent $Ga_2O_3$ and 0.03 mole percent Zn are required (2.2 g, 0.25 g, and 11 mg respectively in a melt containing 40 g of gallium). The resulting p-layer, 12, has a zinc concentration of approximately $4\times10^{17}$ $cm^{-3}$, although a range of $2\text{–}6\times10^{17}$ $cm^{-3}$ is desirable to optimize red luminescence resulting from electron-hole recombination. This layer should be at lesat 10 $\mu$ in thickness. The layer is then annealed at 600 degrees C for 16 hours to increase the concentration of Zn-O iso-electronic traps needed for luminescence. An anneal at 500 to 900 degrees C for 1 to 24 hours could be utilized.

To complete the structure, metal contacts 13 and 14 are deposited on the p- and n-regions of the device respectively so that a forward bias may be applied thereto.

Figure 2:
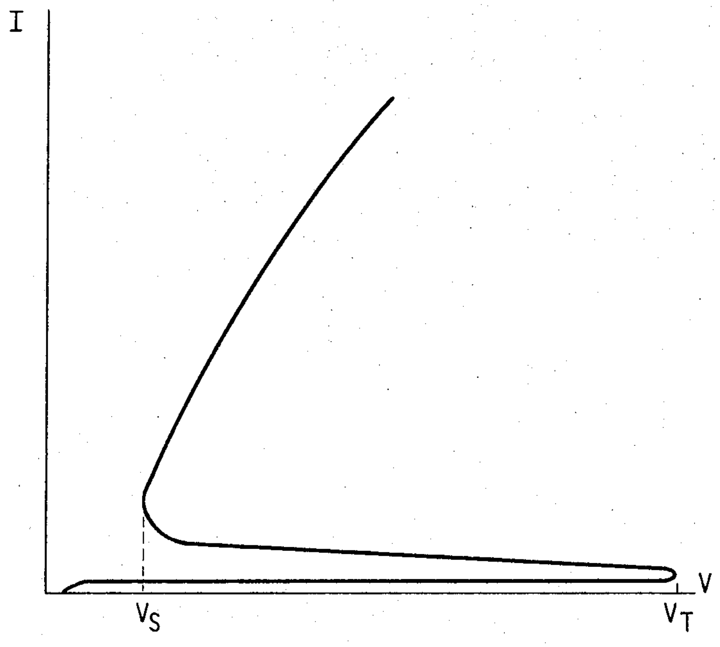
FIG. 2 is an illustration of a typical current-voltage characteristic exhibited by a device in accordance with one embodiment of the invention.

A typical current-voltage characteristic of the device is shown in FIG. 2. It can easily be seen that the device shows a high impedance state when a forward bias is first applied. However, when the applied voltage reaches a threshold, $V_T$, the device switches to a second stable state characterized by a high current and low voltage. This conducting state will be maintained so long as the applied potential does not fall below a certain sustaining value, $V_S$. This conducting state is also characterized by luminescence from the p layer of the device, while no significant luminescence results during the nonconducting state. Typically, the threshold voltage, $V_T$, is on the order of 10 volts for a semi-insulating thickness of 20–30 $\mu$. For a matrix array, a threshold voltage in the range of 4–50 volts would be required. The sustaining voltage, $V_S$, is typically 2 volts for the same semi-insulating thickness. A range of 2–5 volts is generally required. It has been found that $V_T$ and $V_S$ are related to thickness, L, of the semi-insulating region according to the equations:

$$V_T \approx 0.001\, L^3 \qquad (1)$$

and $$V_S \approx 0.002\, L^2 + 1.9 \qquad (2)$$

where $L$ is measured in microns.

In order to better appreciate the distinctions of this device over those of the prior art and to consider possible alternative embodiments, there is presented here a brief description of the operating mechanisms of the device. As noted above, the semi-insulating region contains a deep donor impurity compensated by a shallow acceptor impurity. A "deep donor impurity" is understood in the art to be an impurity with an energy level, $E_I$, such that:

$$|E_C - E_I| >> kT \qquad (3)$$

where $E_C$ is the energy of the conduction band in the semi-insulator, $k$ is Boltzman's constant and $T$ is temperature. That is, the energy of the impurity as referenced to the conduction band should be at least a factor of 10 greater than the thermal energy $kT$. Likewise a shallow acceptor impurity is given by:

$$|E_I - E_V| \approx kT \qquad (4)$$

where $E_I$ is the energy level of the acceptor impurity and $E_V$ is the valence band energy. It should also be noted that a "semi-insulating" region is defined as a region of high resistivity wherein the energy levels satisfy the following:

$$|(E_C - E_F/kT)| >> 1 \qquad (5)$$

and $$|(E_F - E_V/kT)| >> 1 \qquad (6)$$

where $E_F$ is the Fermi level energy. The inequalities of equations (5) and (6) should be at least a factor of 10.

As a result of these energy relationships, electrons from the deep donor sites fall into the shallow acceptor sites. Thus, when a forward bias is applied to the device, electrons which are injected into the semi-insulation region from the n-region tend to be trapped by the deep donor sites resulting in the low conductance state previously described. The deep donor impurity preferentially captures electrons rather than holes, although holes can recombine with electrons trapped at the donor sites. Therefore, in the low conductance state a trapped positive space charge is established in the semi-insulating region near the p-region, and a negative space charge is established in the vicinity of the n-region. These space charges are barriers to the injection of additional electrons and holes, and, therefore, the current flow is small. When the potential reaches its threshold value, $V_T$, the point is reached where the drift time due to the electric field across the semi-insulator becomes less than or equal to the electron lifetime which, in turn, increases as the traps are filled. The electron and hole injection associated with the increased current neutralizes the trapped space charges and reduces the voltage across the device. The device then switches to its conducting state where a significant portion of the injected electrons cross the semi-insulating region into the p-region. Once injected into the p-region, the electrons are trapped at the Zn-O centers and eventually recombine with holes in the p-region to emit red light in the same manner as a conventional device. The device will remain in this conducting state as long as the applied potential remains above $V_S$. If a potential below this value is supplied, the oxygen traps in the semi-insulator become partially depleted and the device returns to its nonconducting state.

One important feature of this device should be emphasized. Prior art negative resistance light emitting devices such as GaAs devices have taught double injection of electrons and holes into the semi-insulating region and recombination therein so that trapping and luminescence result in the semi-insulating region. The present device is designed specifically to cause trapping in the semi-insulating region and luminescence in the p-region. In accordance with this principle, only impurities which form weak recombination centers in the semi-insulator are chosen. By "weak" recombination center it is meant that the time it takes for an electron injected into the semi-insulating region to be trapped at an empty oxygen site is much less than the time it takes for a hole injected from the p-region to recombine with an electron at the oxygen site. Thus, the recombination time of the deep impurity should be greater than the trapping time by at least a factor of 100. At the same time, the recombination time of the deep impurity should be as long as possible so that recombination in the semi-insulator is insignificant. In this regard, the recombination time of the deep impurity should be at least 40 nanoseconds, so that the addition of the deep recombination center will not significantly decrease the recombination time of the semi-insulating region of the latching device. Recombination is further retarded by providing a relatively lightly doped p-region. ($2–6\times10^{17}$ $cm^{-3}$) which minimizes hole injection into the semi-insulator.

While oxygen and carbon have been mentioned as the deep and shallow impurities in the embodiment previously described, other impurities can fulfill the necessary requirements. For example, Zn, Cd or Be may be substituted for carbon as the shallow acceptor. In addition, chromium or iron may be used as deep acceptor impurities compensated by shallow donor impurities such as S, Se, Si or Te. These impurities should meet all the requirements described above including equations (3) and (4), taking into account that deep acceptors are referenced to the valence band and shallow donors are referenced to the conduction band.

It should also be clear that many other variations of the embodiment described are possible. The n-region, for example, can be $Al_xGa_{1-x}P$ ($0 < X < 1$) and still maintain sufficient electron injection. By the same token, the semi-insulator can also be $Al_xGa_{1-x}P$ ($0 < X < 1$) since the band gap is larger than GaP and therefore electron injection into the p-region would still be favored. Such a region can be grown by liquid phase epitaxy in the same manner as the GaP semi-insulator, with the addition of Al to the melt. Another dopant which can be utilized in the p-region for red luminescence in place of Zn is Cd. In addition, green luminescent devices may also be fabricated in accordance with the invention. In such devices the p-region, and preferably all three regions, would be doped with nitrogen. All other impurities described for the red luminescent device would still be present with the exception of the omission of oxygen in the p-region.

Additional layers of material may be built on the basic device of FIG. 1 for circuit operations. For example, if another GaP or $Al_xGa_{1-x}P$ semi-insulating layer is grown by the same procedure on the n-region or p-region, a series resistance is built into the device which is needed in certain applications.

Various additional modifications and extensions of the invention will become apparent to those skilled in the art. All such deviations which basically rely on the teachings through which the invention has advanced the art are properly considered within the spirit and scope of the invention.

What is claimed is:

1. A light emitting device comprising:

a region of semiconductor material of n-conductivity type selected from the group consisting of GaP and $Al_xGa_{1-x}P$ where $0 < X < 1$;

a semi-insulating region selected from the group consisting of GaP and $Al_xGa_{1-x}P$ where $0 < X < 1$ contiguous to said n-type region, said semi-insulating region containing a deep level impurity compensated with a shallow level impurity for trapping of free carriers injected under forward bias said deep level impurity forming a weak recombination center in said semi-insulating region;

and a region of GaP of p-type conductivity contiguous to said semi-insulating region, said p-region containing impurities which form iso-electronic traps to allow recombination of free carriers therein resulting in photon emission.

2. The device according to claim 1 wherein the deep level impurity satisfies the relationship:

$$|E - E_I| >> kT$$

and the shallow level impurity satisfies the relationship:

$$|E_I - E| \approx kT$$

where $E_I$ is the energy of the impurity, $k$ is Boltzman's constant, $T$ is temperature and $E$ is the band energy which is the conduction band for a deep impurity and the valence band for an acceptor impurity.

3. The device according to claim 1 wherein the recombination time of the deep level impurity is greater than the trapping time by at least a factor of 100 and the recombination time is at least 40 nanoseconds.

4. The device according to claim 1 wherein the deep level impurity comprises an impurity selected from the group consisting of oxygen, chromium and iron, and the shallow level impurity comprises an impurity selected from the group consisting of carbon, sulfur, selenium, silicon, tellurium, zinc, cadmium and beryllium.

5. The device according to claim 1 wherein the semi-insulating region comrpises GaP, the deep level impurity comprises oxygen and the shallow level impurity comprises carbon.

6. The device according to claim 5 wherein the concentration of oxygen is approximately $1\times10^{16} - 3\times10^{17}$ $cm^{-3}$ and the concentration of carbon is approximately $5\times10^{15} - 3\times10^{17}$ $cm^{-3}$.

7. The device according to claim 1 wherein the thickness of the semi-insulating region is approximately 10–100 microns.

8. The device according to claim 1 wherein the thickness of the p-type region is at least 10 microns.

9. The device according to claim 1 wherein the impurities contained in said p-type region comprise zinc.

10. The device according to claim 9 wherein the concentration of zinc is approximately $2–6\times10^{17}$ $cm^{-3}$.

11. The device according to claim 1 wherein the impurities contained in said p-region comprise nitrogen.

12. The device according to claim 1 further comprising a second semi-insulating region selected from the group consisting of GaP and $Al_xGa_{1-x}P$ where $0 < X < 1$ contiguous to the opposite surface of said p-type or n-type regions from the surface contiguous to said first semi-insulating region.

* * * * *